United States Patent
Lim et al.

(10) Patent No.: US 10,566,522 B2
(45) Date of Patent: *Feb. 18, 2020

(54) PLATINUM AND COBALT/COPPER-BASED MULTILAYER THIN FILM HAVING LOW SATURATION MAGNETIZATION AND FABRICATION METHOD THEREOF

(71) Applicant: SK hynix Inc., Gyeonggi-do (KR)

(72) Inventors: Sang-Ho Lim, Gyeonggi-do (KR);
Dong-Su Son, Daejeon (KR);
Tae-Young Lee, Gyeonggi-do (KR);
Seong-Rae Lee, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 63 days.

This patent is subject to a terminal disclaimer.

(21) Appl. No.: 15/410,535

(22) Filed: Jan. 19, 2017

(65) Prior Publication Data

US 2017/0133583 A1    May 11, 2017

Related U.S. Application Data

(63) Continuation-in-part of application No. 14/673,397, filed on Mar. 30, 2015, now abandoned, and a continuation-in-part of application No. 14/403,058, filed as application No. PCT/KR2012/005035 on Jun. 26, 2012, now Pat. No. 9,705,075.

(30) Foreign Application Priority Data

May 22, 2012  (KR) .................... 10-2012-0054188

(51) Int. Cl.
*H01L 43/10* (2006.01)

(52) U.S. Cl.
CPC .................... *H01L 43/10* (2013.01)

(58) Field of Classification Search
None
See application file for complete search history.

(56) References Cited

U.S. PATENT DOCUMENTS

| | | | |
|---|---|---|---|
| 5,568,115 A * | 10/1996 | Kano | B82Y 25/00 257/E43.005 |
| 8,274,811 B2 | 9/2012 | Zhang et al. | |
| 8,920,947 B2 * | 12/2014 | Zhang | G11B 5/66 360/125.31 |

(Continued)

FOREIGN PATENT DOCUMENTS

| | | |
|---|---|---|
| CN | 1042025 | 5/1990 |
| CN | 1054450 | 9/1991 |

(Continued)

OTHER PUBLICATIONS

Yuan, Fu-Te, et al., Enhancement of perpendicular coercivity in L11 CoPt thin films by replacement of Co with Cu, Journal of Applied Physics, 2010, pp. 113909, vol. 108.

(Continued)

*Primary Examiner* — Kevin M Bernatz
(74) *Attorney, Agent, or Firm* — IP & T Group LLP

(57) ABSTRACT

A multilayer thin film for magnetic random access memory that includes thin platinum layers and thin cobalt-copper layers, and more particularly, to a multilayer thin film having magnetic layers including non-magnetic material copper that replaces a portion of the magnetic material cobalt.

12 Claims, 11 Drawing Sheets

(56) References Cited

U.S. PATENT DOCUMENTS

| | | | |
|---|---|---|---|
| 9,705,075 B2* | 7/2017 | Lim | G01R 33/098 |
| 2003/0235717 A1 | 12/2003 | van de Veerdonk et al. | |
| 2011/0122525 A1* | 5/2011 | Nemoto | G11B 5/65 |
| | | | 360/75 |
| 2012/0012953 A1* | 1/2012 | Lottis | B82Y 25/00 |
| | | | 257/421 |
| 2012/0299134 A1* | 11/2012 | Jan | H01L 43/08 |
| | | | 257/421 |
| 2014/0284742 A1* | 9/2014 | Sawada | H01L 43/08 |
| | | | 257/427 |
| 2014/0346518 A1* | 11/2014 | Kariyada | G11C 11/161 |
| | | | 257/53 |
| 2015/0115379 A1 | 4/2015 | Lim et al. | |

FOREIGN PATENT DOCUMENTS

| | | |
|---|---|---|
| CN | 1140320 | 1/1997 |
| JP | 3042878 | 3/2000 |
| JP | 2003-228815 | 8/2003 |
| KR | 1020020060483 | 7/2002 |
| KR | 1020080048151 | 6/2008 |
| KR | 1020090037970 | 4/2009 |
| KR | 1020110058750 | 6/2011 |
| KR | 101287370 | 7/2013 |
| WO | WO 2013176332 | 11/2013 |

OTHER PUBLICATIONS

Yuan, Fu-Te, et al., Coercivity enhancement in L11 Co50-xCuxPt50 thin films, Journal of Applied Physics, 2011, pp. 07B714, vol. 109.

Nishimura, Naoki, et al., Magnetic tunnel junction device with perpendicular magnetization films for high-density magnetic random access memory, Journal of Applied Physics, Apr. 2002, pp. 5246-5249, vol. 91, No. 8.

Shima, T., et al., Low-temperature fabrication of L10 ordered FePt alloy by alternate monatomic layer deposition, Applied Physics Letters, Jan. 2002, pp. 288-290, vol. 80, No. 2.

Zeper, W. B., et al., Hysteresis, microstructure, and magneto-optical recording in Co/Pt and Co/Pd multilayers, Journal of applied physics, 1991, pp. 2264-2271, vol. 70, No. 4.

Ikeda, S., et al., A perpendicular-anisotropy CoFeB—MgO magnetic tunnel junction, Nature Materials, 2010, pp. 721-724, vol. 9.

Lee, T., et al., High post-annealing stability in [Pt/Co] multilayers, Journal of Applied Physics, 2013, p. 216102, vol. 113.

Lee, T., et al., Effects of Co layer thickness and annealing temperature on the magnetic properties of inverted [Pt/Co] multilayers, Journal of Applied Physics, 2013, p. 173909, vol. 114.

S. Bandiera et al., Enhancement of perpendicular magnetic anisotropy through reduction of Co—Pt interdiffusion in (Co/Pt) multilayers 100, 142410, 2012.

* cited by examiner

PLATINUM AND COBALT/COPPER-BASED MULTILAYER THIN FILM HAVING LOW SATURATION MAGNETIZATION AND FABRICATION METHOD THEREOF

CROSS-REFERENCE TO RELATED APPLICATIONS

The present application is a Continuation in Part of U.S. patent application Ser. No. 14/673,397 filed on Mar. 30, 2015 and abandoned, and U.S. patent application Ser. No. 14/403,058 filed on Nov. 21, 2014 and issued on Jul. 11, 2017 as U.S. Pat. No. 9,705,075, which is a national phase application of PCT application PCT/KR2012/005035 filed on Jun. 26, 2012 of which claims priority of Korean Patent Application No. 10-2012-0054188, filed on May 22, 2012. The disclosure of each foregoing application is incorporated herein by reference in its entirety.

BACKGROUND

1. Field

Exemplary embodiments relate to a platinum and cobalt/copper-based multilayer thin film, a fabrication method thereof, and the use thereof in magnetic random access memory (MRAM).

2. Description of the Related Art

In an effort to overcome volatility of dynamic random access memory (DRAM), which is a semiconductor memory device that is widely used in electronic devices such as, personal computers (PCs) and mobile phones, studies on magnetic random access memory (MRAM) having non-volatile memory characteristics have been actively conducted. Non-volatile memory can retain data even when a power supply is interrupted. Particularly, in recent years, the integration density of dynamic random access memory reached a limit, and thus magnetic random access memory has been considered as a substitute for dynamic random access memory. Therefore, in related industrial fields, research and development of the MRAM has been actively conducted.

Studies on magnetic random access memory have been conducted since the early 2000s. The early studies were mainly focused on changing the resistance of tunneling magneto-resistance devices by reversing magnetization using a magnetic field created by application of an electric current. However, MRAM devices based on this tunneling magneto-resistance have a shortcoming in that, as the size of the devices decreases, the amount of writing current greatly increases, making it difficult to realize a large-scale, densely integrated memory.

Due to this shortcoming, an MRAM technology based on spin-transfer torque magnetization switching was introduced. It is a type of current-induced magnetization switching, and is based on a method of switching magnetization using a spin-transfer torque (hereinafter referred to as SU) generated by applying a current to a magnetic thin film. The MRAM based on this method is referred to as STT-MRAM. Spin-transfer torque magnetization switching provides various advantages, including high integration density, wide write window and low power consumption, compared to existing magnetic field-induced magnetization switching.

Prior studies on the STT-MRAM were focused mainly on magnetic tunnel junctions (hereinafter referred to as MTJs) with in-plane magnetic anisotropy. Recently, in-plane magnetic tunnel junctions (iMTJs), which have a relatively low critical current density while maintaining their thermal stability in nanosized magnetic cells, were also developed. Such results were mostly obtained in MgO-based structures having an exchange-coupled trilayer including a free layer and a pinned layer, but a MTJ that requires a lower critical current density (e.g., 1 MA/cm$^2$ or less) is required to realize a highly integrated MRAM device for commercial use.

In view of this disadvantage of iMTJ, an MJG with perpendicular magnetic anisotropy (hereinafter referred to as PMA) has a very big advantage in that the critical current density required for magnetization switching is low. This is because the iMTJ requires additional torque to overcome a demagnetizing field (2n $M_s$, where $M_s$=saturation magnetization) during magnetization switching, and thus it is difficult to lower the critical current density. For this perpendicular MTJ (pMTJ), it is most important to develop materials and structures, which have excellent PMA properties (PMA energy density=about 10$^7$ erg/cc). However, from the view point of magnetostatic energy, PMA should overcome a very high demagnetizing field, and thus it is fundamentally difficult to develop materials and structures, which have excellent PMA properties.

High-density magnetic random access materials are required to have strong perpendicular magnetic anisotropy. This property should be achieved in very thin films having a thickness of 3 nm or less. Perpendicular magnetic anisotropy is largely divided into one caused by interfaces and one caused by bulk properties. Until now, four kinds of materials with perpendicular magnetic anisotropy have been mainly studied, including rare earth-3d transition metal amorphous alloys [N. Nishimura et al., J. Appl. Phys. 91, 5246 (2002).], intermetallic compounds, such as FePt and CoPt, which have the L1$_0$ structure [T. Shima et al., Appl. Phys. Lett. 80, 288 (2002)], multilayer thin films such as [W. B. Zeper et al., J. Appl. Phys. 70, 2264 (1991)], and CoFeB/MgO interfaces [S. Ikeda et al., Nature Mater. 9, 721 (2010)]. It is understood that the former two materials have intrinsic bulk properties, and the latter two materials have perpendicular magnetic anisotropy at the interfaces.

However, rare earth-3d transition metal amorphous alloys have issues in that the PMA energy density is insufficient and in that crystallization occurs even at a relatively low temperature (about 300° C.) to rapidly reduce the perpendicular magnetic anisotropy (PMA) properties. Also, multilayer thin-film structures such as CoPd and CoPt have sufficient PMA energy density, but have an issue in that the structure thereof is not maintained at a temperature ranging from about 350° C. to 500° C., which is used in magnetic random access memory fabrication processes. Thus, the PMA properties are reduced or lost. CoFeB/MgO interfaces have issues in that perpendicular magnetic anisotropy is exhibited only at a very thin CoFeB thickness, generally 1.5 nm or less, and in that the distribution of anisotropy is not good. However, intermetallic compounds such as, FePt and CoPt, which have the L1$_0$ structure, are currently known as materials having the best characteristics, since the PMA energy density is sufficiently high and the temperature characteristics are also good. However, the intermetallic compounds with the L1$_0$ structure also have an issue in that these compounds are not suitable for temperature conditions that are used in current memory device processes, since a temperature higher than 600° C. is required to form an intermetallic compound having a high long-range order which is known as the most important factor for perpendicular magnetic anisotropy. Additionally, there is a problem in that it is not easy to design a seed layer and a buffer layer, which are required to form the (001) texture essential for perpendicular magnetic anisotropy.

Accordingly, due to the above-described concerns, there is a need for a new material and structure which is suitable for use at the heat treatment temperature that is used in current memory fabrication processes, and at the same time, has sufficient perpendicular magnetic anisotropy density, and can be used for high-density magnetic random access memory. Embodiments relate to the fabrication of a multilayer thin film comprising platinum, cobalt and copper, which has perpendicular magnetic anisotropy and low saturation magnetization, and at the same time, is suitable for use at the magnetic random access memory process temperature (350° C. to 500° C., and suitable for serving as a multilayer thin film in magnetic random access memory.

Specifically, an embodiment is intended to reduce the influence of stray fields in high-density magnetic random access memory cells by greatly reducing saturation magnetization while maintaining perpendicular magnetic anisotropy by replacing a portion of cobalt in a platinum-cobalt multilayer thin film with copper. This magnetic multilayer thin film has properties suitable for use in a high-density magnetic random access cell, particularly a pinned structure in the cell.

SUMMARY

Various embodiments are directed to a perpendicular magnetic anisotropy multilayer thin film including thin platinum layers and thin cobalt-copper layers, which has low saturation magnetization together with perpendicular magnetic anisotropy, securely maintains its structure and perpendicular magnetic anisotropy even after being subjected to a heat treatment process, may have a further reduced saturation magnetization after heat treatment, and thus is suitable for use in a high-density magnetic random access memory cell or a pinned structure in the cell.

Also, various embodiments are directed to a method for fabricating a platinum and cobalt/copper-based multilayer thin film as described above.

Furthermore, various embodiments are directed to a cobalt and platinum-based multilayer thin film, which securely maintains its structure and properties even in the heat-treatment temperature range that is used in current memory fabrication processes, and at the same time, has excellent perpendicular magnetic anisotropy (PMA) in order to realize a perpendicular magnetic tunnel junction (pMTJ).

Also, various embodiments are directed to a method for fabricating the above cobalt and platinum-based multilayer thin film.

In an embodiment, a perpendicular magnetic anisotropy multilayer thin film for magnetic random access memory may include a thin platinum layer and a thin cobalt-copper layer alternately deposited to form a multilayer thin film over a substrate.

In an embodiment, a content ratio of cobalt:copper in the thin cobalt-copper layers may be 50:50 to 90:10 (atomic ratio).

In an embodiment, the multilayer thin film including the thin platinum layer and the thin cobalt-copper layer may be repeatedly stacked over the substrate 2-10 turns.

In an embodiment, the multilayer thin film may have a total thickness of 0.24-12.5 nm.

In an embodiment, a thickness ratio of the thin cobalt-copper layer to the thin platinum layer may be 0.6-4.0:1.

In an embodiment, the thickness ratio of the thin cobalt-copper layer to the thin platinum layer may be 0.6-1:1.

In an embodiment, the thickness ratio of the thin cobalt-copper layer to the thin platinum layer may be 1-4:1.

In an embodiment, the perpendicular magnetic anisotropy multilayer thin film may further include a stack of a buffer layer provided between the substrate and the multilayer thin film, and a protective layer deposited over the multilayer thin film.

In an embodiment, each of the buffer layer, the seed layer, and the protective layer independently may include gold (Au), palladium (Pd), copper (Cu), platinum (Pt), tantalum (Ta), ruthenium (Ru), or a combination thereof.

In an embodiment, a method for fabricating a perpendicular magnetic anisotropy multilayer thin film for magnetic random access memory may include mixing cobalt with copper to prepare a mixed metal; alternately depositing platinum and the mixed metal over a substrate to form a multilayer thin film, wherein the multilayer thin film includes a thin platinum layer and a thin cobalt-copper layer; and heat-treating the multilayer thin film.

In an embodiment, the heat-treating is performed at a temperature between 150° C. and 550° C.

In an embodiment, the method may further include depositing a buffer layer and a seed layer over the substrate before depositing the multilayer thin film; and depositing a protective layer over the multilayer thin film after depositing the multilayer thin film.

In an embodiment, a content ratio of cobalt:copper in the thin cobalt-copper layer may be 50:50 to 90:10 (atomic ratio).

In an embodiment, the heat-treating may be performed to form a platinum-cobalt-copper bulk structure, and the platinum-cobalt-copper bulk structure may exhibit perpendicular magnetic anisotropy.

BRIEF DESCRIPTION OF THE DRAWINGS

FIG. 8b is a graph showing the profile of each of components for the portions indicated by red dotted lines in FIG. 8a.

FIG. 9a: before heat treatment; FIG. 9b: after heat treatment at 300° C.; and FIG. 9c: after heat treatment at 450° C.

FIG. 10a: before heat treatment; FIG. 10b: after heat treatment at 300° C.; and FIG. 10c: after heat treatment at 450° C.

DETAILED DESCRIPTION

Figure 1:
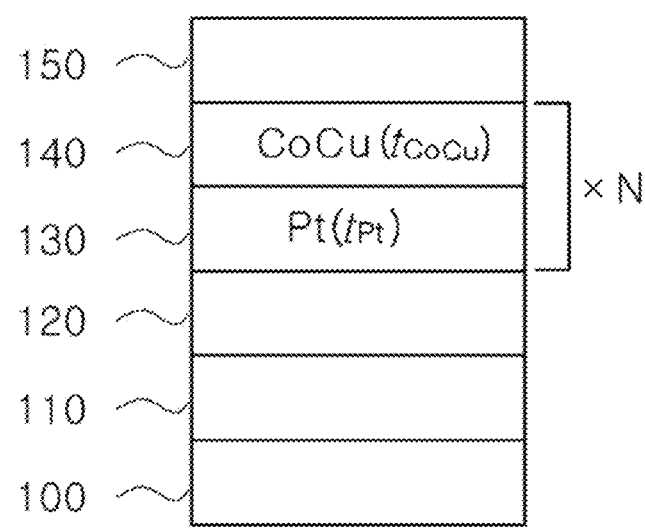
FIG. 1 is a cross-sectional view illustrating the structure of a multilayer thin film according to an embodiment.

Various embodiments will be described below in more detail with reference to the accompanying drawings. The embodiments may be modified in different forms and should not be construed as limiting. Throughout the disclosure, like reference numerals refer to like parts throughout the various figures and embodiments.

The drawings are not necessarily to scale and in some instances, proportions may have been exaggerated to clearly illustrate features of the embodiments. When a first layer is referred to as being "on" a second layer or "on" a substrate, it not only refers to a case in which the first layer is formed directly on the second layer or the substrate but also a case in which a third layer exists between the first layer and the second layer or the substrate.

Hereinafter, embodiments will be described in further detail.

An embodiment provides perpendicular magnetic anisotropy multilayer thin film for magnetic random access memory, which includes thin platinum layers and thin cobalt-copper layers alternately deposited on a substrate.

The multilayer thin film having perpendicular magnetic anisotropy according to an embodiment has magnetic layers including a non-magnetic material such as copper. In a conventional multilayer thin film, magnetic layers are made only of a magnetic material, and it includes a structure in which non-magnetic thin layers of platinum and magnetic thin layers of cobalt-copper are alternately deposited on a substrate. In contrast, in an embodiment, copper replaces a portion of the magnetic material such as cobalt. Due to the this structure of the multilayer thin film according to an embodiment, the saturation magnetization of the multilayer thin film can be greatly reduced while the perpendicular magnetic anisotropy is maintained, and thus electromagnetic interactions therein can be reduced, thereby reducing the influence of stray fields. Additionally, due to the above-described structure, after the multilayer thin film formed was heat-treated at a temperature (350 to 500° C.) suitable for magnetic random access memory fabrication processes, a new platinum-cobalt-copper intermetallic compound having a bulk structure is formed, and thus the multilayer thin film can exhibit perpendicular magnetic anisotropy, even though interfaces formed between the thin platinum layers and the thin cobalt-copper layers disappeared. In addition, the saturation magnetization of the multilayer thin film is reduced compared to that before heat treatment, and the in-plane saturation field is increased. This indicates that the multilayer thin film according to an embodiment has properties suitable for use in a high-density magnetic random access memory cell, particularly a pinned structure in the cell, compared to a conventional multilayer thin film.

In an embodiment of the present invention, a thin film may be a layer of material ranging from fractions of nanometer (nanolayer) to several micrometers in thickness.

In an embodiment, the content ratio of cobalt:copper in the thin cobalt-copper layers may range from 50:50 to 90:10 (atomic ratio), and preferably from 85:15 to 70:30 (atomic ratio).

According to an embodiment, a perpendicular magnetic anisotropy of the multilayer thin film for magnetic random access memory, which has a controlled saturation magnetization, can be obtained by controlling the cobalt:copper content ratio of the thin cobalt-copper layers within the above-specified range.

If the content of cobalt in the thin cobalt-copper layers is higher than the upper limit of the above-specified cobalt:copper content ratio range and if the content of copper is lower than the lower limit of the above range, the content of copper in the magnetic layers will be too low, and thus the degree of a decrease in the saturation magnetization compared with a conventional perpendicular magnetic anisotropy multilayer thin film including magnetic layers made only of cobalt, will be insignificant. Accordingly, the degree of a decrease in the influence of stray fields will be low, indicating that the multilayer thin film will be difficult to apply to a pinned structure in a magnetic random access memory cell. If the content of cobalt is lower than the lower limit of the cobalt:copper content ratio range and if the content of copper is higher than the upper limit of the above range, the content of the non-magnetic material copper will be higher than that of the magnetic material cobalt, and thus the multilayer thin film will lose its perpendicular magnetic anisotropy, or the perpendicular magnetic anisotropy energy density of the multilayer thin film will greatly decrease, indicating that the multilayer thin film will be difficult to apply to a magnetic random access memory cell.

In the multilayer thin film according to an embodiment, the thickness of each of the thin platinum layers may be 0.15 nm to 0.25 nm, and the magnitude of the perpendicular magnetic anisotropy energy of the multilayer thin film can be controlled by controlling the thickness of the thin cobalt-copper layers that are deposited alternately with the thin platinum layers. According to an embodiment, the thickness of each of the thin cobalt-copper layers may range from 0.1 nm to 1.00 nm when the thickness of each of the thin platinum layers is in the above-described range. If the thickness of each of the thin cobalt-copper layers is out of the above range, the perpendicular magnetic anisotropy energy density of the multilayer thin film will decrease, or a new bulk structure based on platinum-cobalt-copper cannot be produced in the heat treatment step.

In the multilayer thin film according to an embodiment, the ratio of the thickness of the thin cobalt-copper layers to the thickness of the thin platinum layers may be 0.6-4:1. If the ratio of the thickness of the thin cobalt-copper layers to the thickness of the thin platinum layers is less than 0.6:1, the thickness of the thin cobalt-copper layers will be too small than that of the thin platinum layers, perpendicular magnetic anisotropy will not be formed after the heat treatment step, or the perpendicular magnetic anisotropy energy density formed will be too low, indicating that the multilayer thin film will be difficult to apply to a magnetic random access memory cell. If the ratio of the thickness of the thin cobalt-copper layers to the thickness of the thin platinum layers is more than 4:1, the thickness of the thin cobalt-copper layers will be too great, and thus the perpendicular magnetic anisotropy energy density of the multilayer thin film will be reduced.

Moreover, the multilayer thin film according to an embodiment may have either a structure in which the thickness of the thin cobalt-copper layers is smaller than or equal to that of the thin platinum layers (1 of the thin platinum layers: 0.6-1 of thin cobalt-copper layers), or a structure in which the thickness of the thin cobalt-copper layers is greater than that of the thin platinum layers (1 of the thin platinum layers: 1-4 of the thin cobalt-copper layers). According to an embodiment, the perpendicular magnetic anisotropy of the multilayer thin film can increase as the ratio of the thickness of the thin cobalt-copper layers to the thickness of the thin platinum layers increases within the above thickness range. The thickness of the thin cobalt-copper layers is preferably greater than the thickness of the thin platinum layers, and in this case, the multilayer thin film shows low saturation magnetization while it maintains desirable perpendicular magnetic anisotropy even after heat treatment, due to its high thermal stability.

Figure 2:
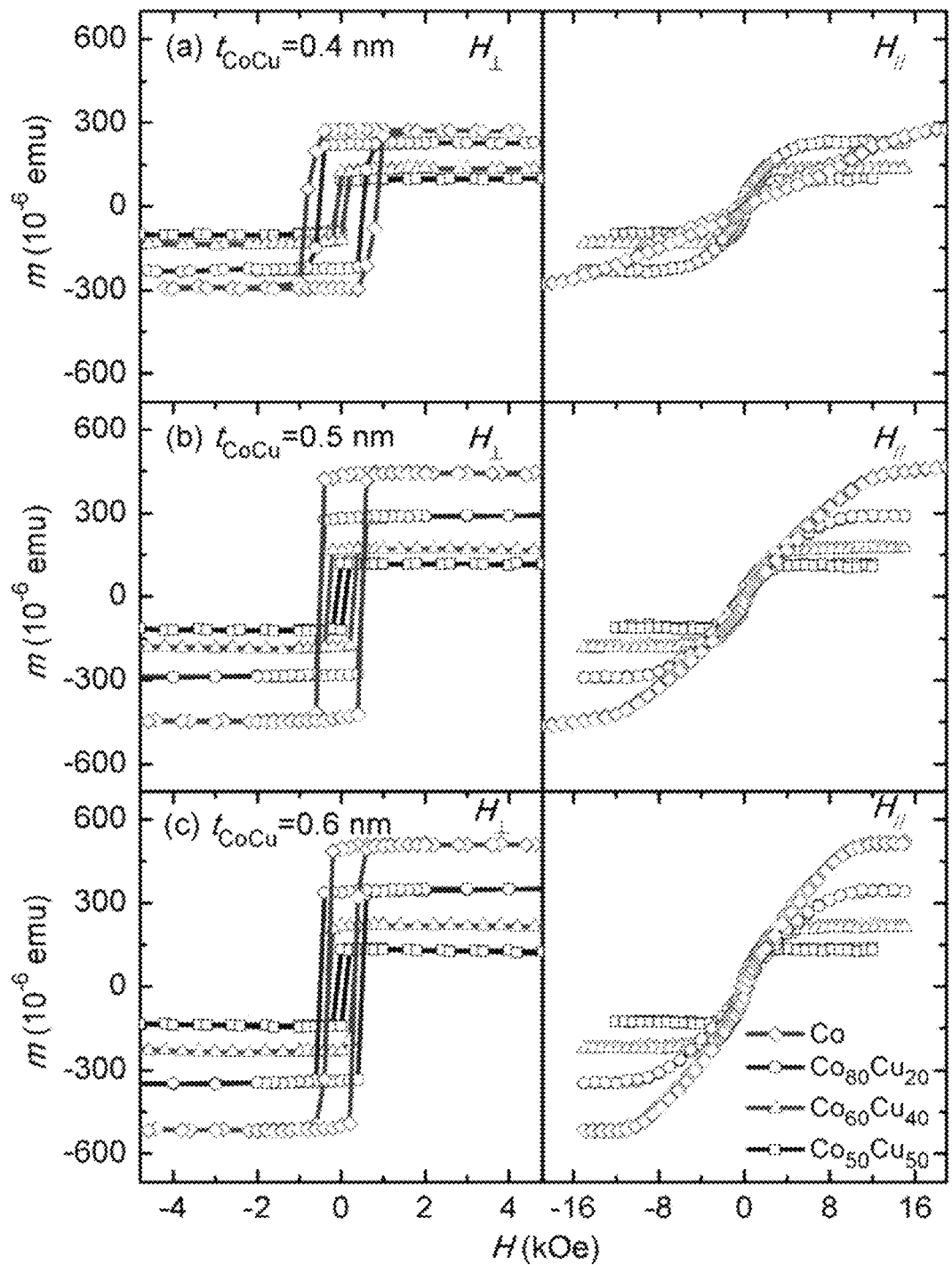
FIG. 2 depicts magnetic moment (m)-hysteresis (H) curves measured before heat treatment of [Pt(0.2 nm)/CoCu ($t_{CoCu}$ nm)]$_6$ (wherein platinum thickness ($t_{pt}$) is fixed to 0.2 nm, and cobalt-copper thickness ($t_{CoCu}$) is variable) that is a multilayer thin film fabricated according to an embodiment. The cobalt-copper thickness ($t_{CoCu}$) is set as follows. (a): $t_{CoCu}$ (0.4 nm), (b): $t_{CoCu}$ (0.5 nm), and (c): $t_{CoCu}$ (0.6 nm).
Figure 4:
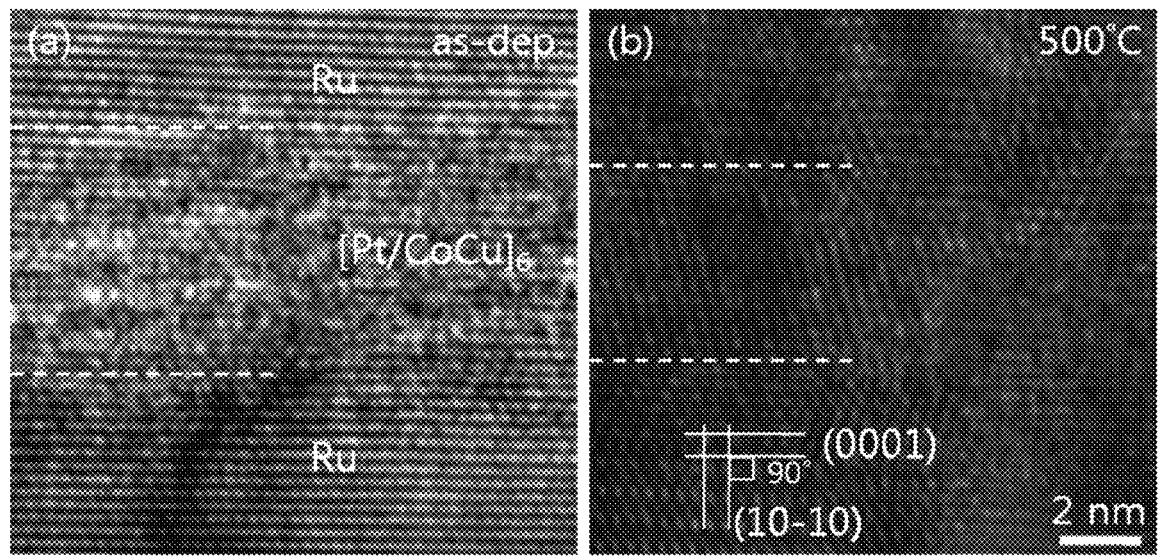
FIG. 4 illustrates scanning transmission electron microscopy images of a multilayer thin film according to an embodiment.
Figure 5:
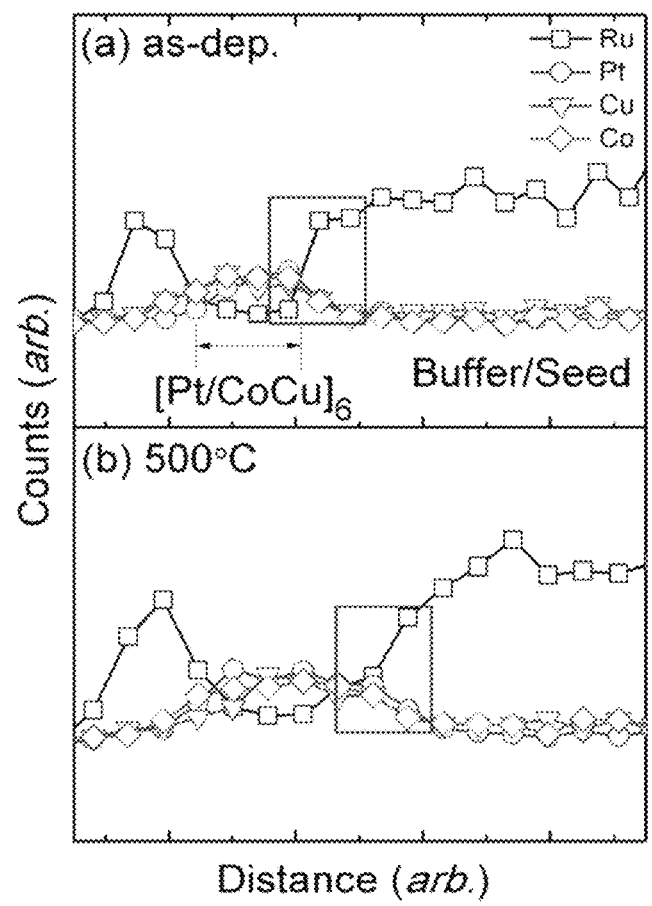
FIG. 5 is a set of graphs illustrating the results of energy dispersive X-ray spectroscopy (EDS) performed to analyze the elements of a multilayer thin film according to an embodiment. (a) shows a state before heat treatment is made; and (b) shows a state after heat treatment is made at 500° C.
Figure 6:
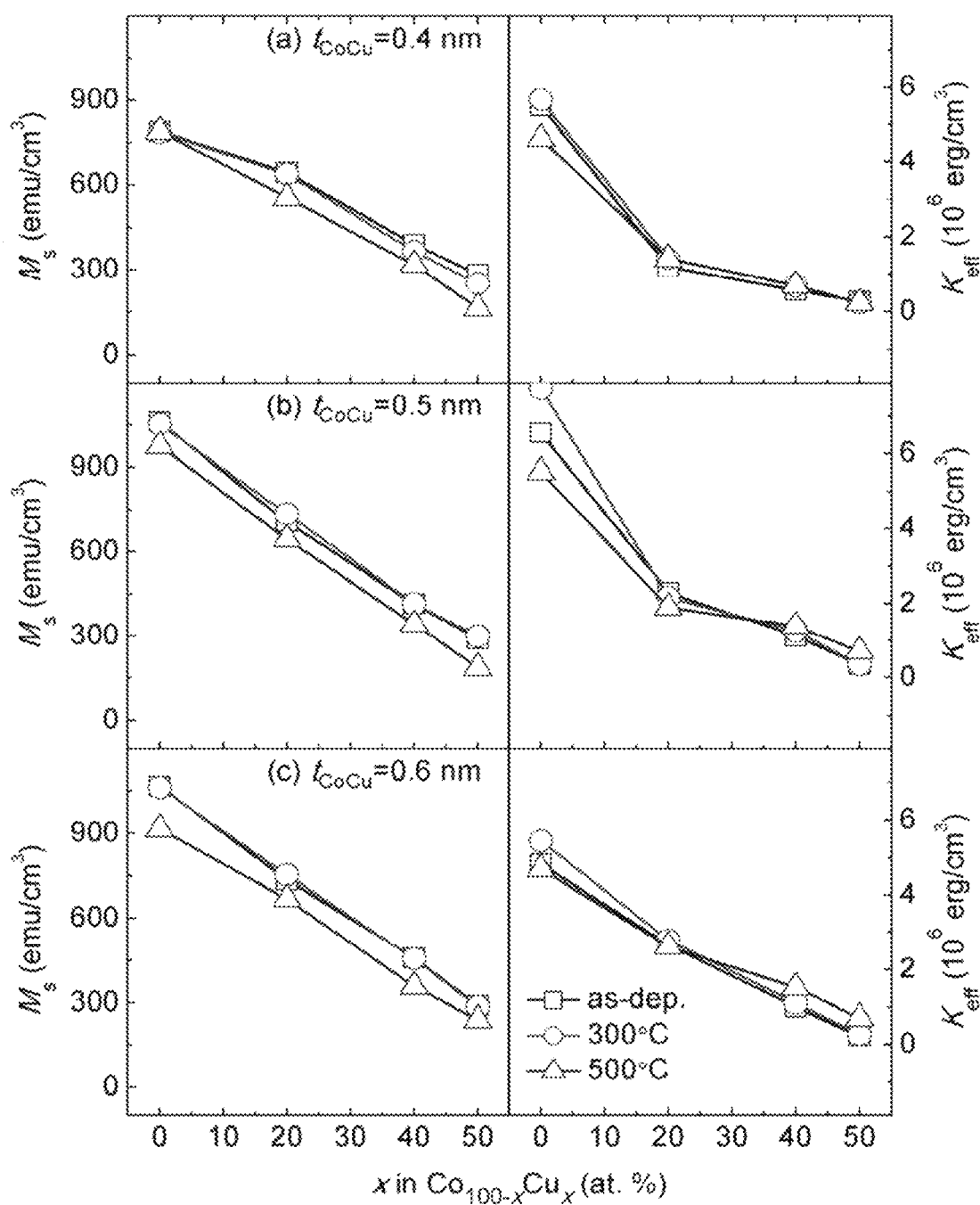
FIG. 6 is a set of graphs illustrating saturation magnetization ($M_s$) and perpendicular magnetic anisotropy energy density ($K_{eff}$) as a function of copper content and heat treatment temperature for [Pt(0.2 nm)/CoCu($t_{CoCu}$ nm)]$_6$. (wherein platinum thickness ($t_{pt}$) is fixed to 0.2 nm and cobalt-copper thickness ($t_{CoCu}$) is variable) that is a multilayer thin film fabricated according to an embodiment. The cobalt-copper thickness ($t_{CoCu}$) is set as follows. (a): $t_{CoCu}$ (0.4 nm), (b): $t_{CoCu}$ (0.5 nm), and (c): $t_{CoCu}$ (0.6 nm).

For example, as illustrated in FIG. 2, in which the thickness of the thin platinum layer was uniform (0.2 nm), the magnetic moment (m) value was lower when the thickness of the thin cobalt-copper layer was 0.4 nm (top graph pair) than when the thickness of the thin cobalt-copper layer was 0.6 nm (bottom graph pair). Furthermore, it could be seen that the saturation magnetization value decreased as the content of copper in the magnetic layers increased. Additionally, as illustrated in FIGS. 4 and 5, after the multilayer thin film was heat-treated at 500° C., an interface between the thin platinum layer and the thin cobalt-copper layer disappeared, and a new platinum-cobalt-copper intermetallic compound having a bulk structure was formed. Furthermore as illustrated in FIG. 6, the multilayer thin film showed no significant difference in the saturation magnetization ($M_s$) value between before heat treatment and after heat treatment at 300° C., but the saturation magnetization ($M_s$) value was generally reduced after heat treatment at 500° C.

In the multilayer thin film for magnetic random access memory according to an embodiment, each of the thin platinum layers and the thin cobalt-copper layers may be deposited once, but the thin platinum layers and the thin cobalt-copper layers are preferably alternately deposited to ensure low saturation magnetization and better perpendicular magnetic anisotropy. Each of the thin platinum layers and the thin cobalt-copper layers may be deposited 1-10 times. However, if each of the layers is deposited more than 10 times, a problem will arise in that, when the resulting multilayer thin film is applied to an actual memory device, the resistance thereof increases, or the critical current value required for magnetization switching increases due to an increase in the volume of the magnetic thin layers, and thus the multilayer thin film is disadvantageous for commercial use.

Thus, when the layers are deposited 1-10 times to have thicknesses in the above-described thickness ranges, the total thickness of the deposited thin platinum layers and thin cobalt-copper layers will range from 0.24 nm to 12.5 nm.

More preferably, the thin platinum layers and the thin cobalt-copper layers may be alternately deposited 4-8 times, and the multilayer thin film will have low saturation magnetization together with high perpendicular magnetic anisotropy. Additionally, the total thickness of the deposited thin platinum layers and thin cobalt-copper layers will range from 0.96 nm to 10.0 nm.

The multilayer thin film according to an embodiment is deposited on a substrate. The substrate may be made of any one of silicon, glass, sapphire and magnesium oxide, but is not limited thereto, and may also be any substrate that is generally used in a related field.

In addition, the multilayer thin film according to an embodiment may further include a buffer layer and a seed layer between substrate, in addition to the alternately deposited thin platinum layers and thin cobalt-copper layers, and may further include a protective layer deposited on the alternately deposited thin platinum layers and thin cobalt-copper layers.

The buffer layer, the seed layer, or the protective layer may be made of any material that is generally used in a related field. For example, the buffer layer, the seed layer, or the protective layer may be made of one or more of gold (Au), palladium (Pd), copper (Cu), platinum (Pt), tantalum (Ta) and ruthenium (Ru), and may be deposited either as a single layer or as a plurality of layers.

FIG. 1 is a cross-sectional view illustrating the structure of a multilayer thin film according to an embodiment. Referring to FIG. 1, a buffer layer 110 is deposited on a substrate 100, and a seed layer 120 is deposited thereon. On the seed layer 120, a thin platinum layer 130 and a thin cobalt-copper layer 140 are alternately deposited N times to have thicknesses of $t_{Pt}$ and $t_{CoCu}$, respectively. Then, a protective layer 150 is finally deposited.

For example, a Ta layer may be deposited as the buffer layer, and a Pt layer, a Ru layer, or a combination thereof may be sequentially deposited as the seed layer 120 thereon. On the seed layer, the thin platinum layer 130 and the thin cobalt-copper layer 140 may be deposited N times, and then a Ru layer may be deposited as the protective layer 150.

The thickness of the seed layer is preferably 5-40 nm, and the seed layer can also participate in the formation of a new bulk structure during heat treatment. If the thickness of the seed layer is less than 5 nm, the multilayer thin film cannot show perpendicular magnetic anisotropy, and if the thickness of the seed layer is more than 40 nm, an increase in the thickness may offset an increase in efficiency.

In another embodiment, a method for fabricating a perpendicular magnetic anisotropy multilayer thin film for magnetic random access memory may include: (1) mixing cobalt with copper to prepare a mixed metal; (2) alternately depositing platinum and the mixed metal of (1) on a substrate to form a multilayer thin film; and (3) heat-treating the multilayer thin film.

In a method for fabricating a perpendicular magnetic anisotropy multilayer thin film for magnetic random access memory according to an embodiment, details regarding the atomic ratio of cobalt and copper in the thin cobalt-copper layers, the thickness of each of the thin platinum layers and the thin cobalt-copper layers, the number of depositions of each of the thin platinum layers and the thin cobalt-copper layers, the material of the substrate, the buffer layer, the seed layer and, the protective layer, are all as described above. According to a method for fabricating a perpendicular magnetic anisotropy multilayer thin film in accordance with an embodiment, magnetic layers are formed to include the non-magnetic material copper that replaces a portion of cobalt, unlike a conventional platinum-cobalt-based multilayer thin film including magnetic layers which are made only of a magnetic material such as cobalt. This replacement of a portion of cobalt with copper in the magnetic layers greatly reduces the saturation magnetization of the multilayer thin film while maintaining its vertical magnetic anisotropy, indicating that the multilayer thin film is suitable for use in a magnetic random access memory cell, particularly a pinned structure in the cell. In addition, according to an embodiment, a multilayer thin film having a desired magnitude of saturation magnetization can be obtained by controlling the ratio of the thickness of the thin cobalt-copper layers to the thickness of the thin platinum layer and the content of copper in the magnetic layers.

In the method according to an embodiment, the temperature of a heat treatment process that is performed after deposition of each layer may range from 150° C. to 550° C. This implies that the heat treatment process according to an embodiment can be performed in a significantly wider temperature range compared to the conventional method, in view of the fact that a multilayer thin film fabrication process according to the conventional method was required to be performed mainly in a low-temperature range (200° C. to 300° C.) due to problems associated with the thermal stability of the thin film structure. Thus, this heat-treatment temperature range in an embodiment enables current memory device processes to be performed in a convenient and economic manner and to be modified in various ways, and makes it possible to select various materials. In a conventional method, when the heat treatment temperature is higher than 550° C., there may be a problem in that perpendicular magnetic anisotropy properties are deteriorated.

Figure 3:
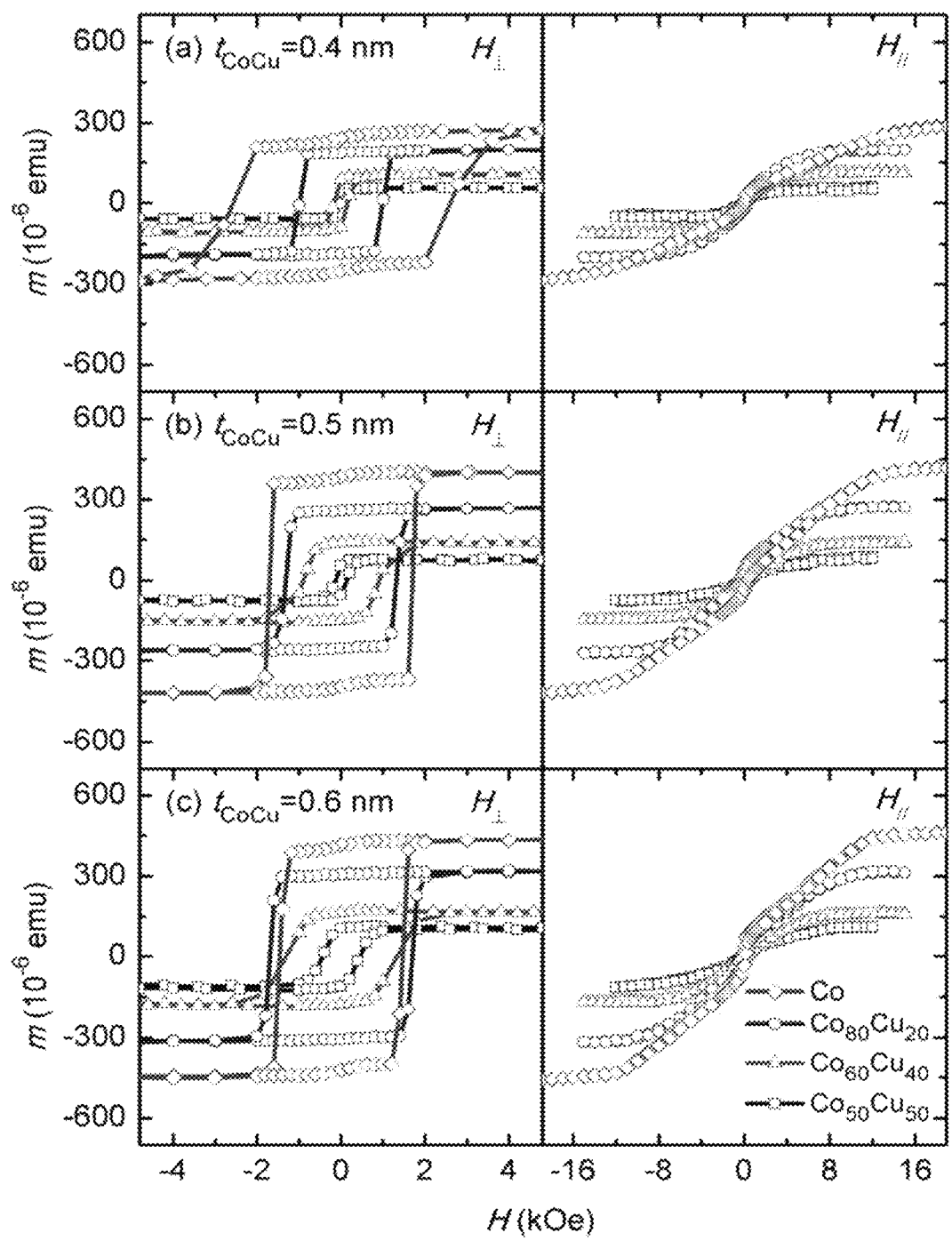
FIG. 3 depicts magnetic moment (m)-hysteresis (H) curves measured before heat treatment at 500° C. of [Pt(0.2 nm)/CoCu($t_{CoCu}$ nm)]$_6$ (wherein platinum thickness ($t_{pt}$) is fixed to 0.2 nm and cobalt-copper thickness ($t_{CoCu}$) is variable) that is a multilayer thin film fabricated according to an embodiment. The cobalt-copper thickness ($t_{CoCu}$) is set as follows. (a): $t_{CoCu}$ (0.4 nm), (b): $t_{CoCu}$ (0.5 nm), and (c): $t_{CoCu}$ (0.6 nm).

FIGS. 2 and 3 shows the results of vibrating sample magnetometry (VSM) performed while applying an external magnetic field in the in-plane direction and the out-of-plane direction to multilayer thin films, which are fabricated while changing the content of copper in the multilayer thin film according to various embodiments. FIG. 2 shows the results of VSM performed before heat treatment, and FIG. 3 shows the results of VSM of the multilayer thin films heat-treated at 500° C.

As can be seen in FIGS. 2 and 3, perpendicular magnetic anisotropy that could be seen in FIG. 2 could also be seen in FIG. 3 which shows the results for a multilayer thin film heat-treated at 500° C. It could be seen in FIG. 3 that the saturation magnetization was reduced, and the in-plane saturation field was increased. This appears to be attributable to the effect of copper that replaces a portion of cobalt.

Hereafter, embodiments will be described in further detail with reference to preferred examples. However, these examples are provided for clarity and do not limit the embodiments.

Example 1-1

A high-quality that is, prime grade, wet-oxidation Si/SiO$_2$ substrate was used. On the substrate, a Ta buffer layer (5 nm thickness) was formed, and Pt (10 nm thickness) and Ru (30 nm thickness) seed layers were formed thereon in the close-packed direction. On the buffer layer and seed layers formed as described above, a thin platinum layer serving as a non-magnetic layer was formed to a thickness of 0.2 nm, and a thin cobalt-copper layer made of a mixture of the magnetic material cobalt and the non-magnetic material copper was deposited.

Each of the thin platinum layer and the thin cobalt-copper layer was alternately deposited 6 times. On the resulting structure, a Ru layer (3 nm thickness) serving as a protective layer was deposited, thereby fabricating a multilayer thin film.

Each of the layers was deposited by a magnetron sputtering deposition process. The base pressure of a chamber used in the deposition was maintained at 1×10$^{-8}$ Torr or lower, and the deposition was performed at a pressure of about 2×10$^{-3}$ under an atmosphere of argon gas.

In the deposition process, all the layers were deposited using single element targets or alloy targets under a vacuum. The stack of the layers deposited as described above is shown in FIG. 1.

The thickness of the thin cobalt-copper layer was 0.4 nm, and cobalt and copper in the thin cobalt-copper layer were mixed at a ratio of 80 atomic percent of cobalt and 20 atomic percent of copper. This may be denoted ($t_{CoCu}$=0.4 nm; Co$_{80}$Cu$_{20}$).

The multilayer thin film fabricated as described above was heat-treated at 500° C. The heat treatment of the multilayer thin film after deposition was performed under a vacuum of 1×10$^{-6}$ Torr in the temperature range of 300 to 500° C. for 1 hour.

Example 1-2

A multilayer thin film ($t_{CoCu}$=0.5 nm; Co$_{80}$Cu$_{20}$) was fabricated in the same manner as described in Example 1-1, except that the thin cobalt-copper layer was deposited to the total thickness of 0.5 nm.

Example 1-3

A multilayer thin film ($t_{CoCu}$=0.6 nm; Co$_{80}$Cu$_{20}$) was fabricated in the same manner as described in Example 1-1, except that the thin cobalt-copper layer was deposited to the total thickness of 0.5 nm.

Example 2-1

A multilayer thin film ($t_{CoCu}$=0.4 nm; Co$_{60}$Cu$_{40}$) was fabricated in the same manner as described in Example 1-1, except that the mixing ratio between cobalt and copper in the thin cobalt-copper layer was changed to 60 atomic percent of cobalt and 40 atomic percent of copper.

Example 2-2

A multilayer thin film ($t_{CoCu}$=0.5 nm; Co$_{60}$Cu$_{40}$) was fabricated in the same manner as described in Example 1-2, except that the mixing ratio between cobalt and copper in the thin cobalt-copper layer was changed to 60 atomic percent of cobalt and 40 atomic percent of copper.

Example 2-3

A multilayer thin film ($t_{CoCu}$=0.6 nm; $Co_{60}Cu_{40}$) was fabricated in the same manner as described in Example 1-3, except that the mixing ratio between cobalt and copper in the thin cobalt-copper layer was changed to 60 atomic percent cobalt and 40 atomic percent of copper.

Example 3-1

A multilayer thin film ($t_{CoCu}$=0.4 nm; $Co_{50}Cu_{50}$) was fabricated in the same manner as described in Example 1-1, except that the mixing ratio between cobalt and copper in the thin cobalt-copper layer was changed to 50 atomic percent of cobalt and 50 atomic percent of copper.

Example 3-2

A multilayer thin film ($t_{CoCu}$=0.5 nm; $Co_{50}Cu_{50}$) was fabricated in the same manner as described in Example 1-2, except that the mixing ratio between cobalt and copper in the thin cobalt-copper layer was changed to 50 atomic percent of cobalt and 50 atomic percent of copper.

Example 3-3

A multilayer thin film ($t_{CoCu}$=0.6 nm; $Co_{50}Cu_{50}$) was fabricated in the same manner as described in Example 1-3, except that the mixing ratio between cobalt and copper in the thin cobalt-copper layer was changed to 50 atomic percent of cobalt and 50 atomic percent of copper).

Comparative Example 1-1

A multilayer thin film ($t_{Co}$=0.4 nm) was fabricated in the same manner as described in Example 1, except that a thin cobalt layer was formed in place of the thin cobalt-copper layer.

Comparative Example 1-2

A multilayer thin film ($t_{Co}$=0.5 nm) was fabricated in the same manner as described in Example 1, except that a thin cobalt layer was formed in place of the thin cobalt-copper layer.

Comparative Example 1-3

A multilayer thin film ($t_{Co}$=0.6 nm) was fabricated in the same manner as described in Example 1, except that a thin cobalt layer was formed in place of the thin cobalt-copper layer.

Test Example 1: Analysis of Magnetic Properties

The magnetic properties of the multilayer thin films fabricated according to Example 1-3 and the Comparative Example were measured using a vibrating sample magnetometer (VSM). FIGS. 2 and 3 show m-H hysteresis curves measured while applying an external magnetic field to the multilayer thin film in the out-of-plane direction and the in-plane direction. FIG. 2 is a graph showing the results of measuring the magnetic properties of the multilayer thin films before heat treatment, and FIG. 3 is a graph showing the results of measuring the magnetic properties of the multilayer thin films after heat treatment at 500° C.

From a comparison between FIGS. 2 and 3, the perpendicular magnetic anisotropy that was seen before heat treatment was still observed even after heat treatment at 500° C., and an increase in the saturation field ($H_s$, hard) together with a decrease in the magnetic moment (m) could be observed after heat treatment. Additionally, it could be seen that the multilayer thin film including the magnetic layer formed of only cobalt had a high magnetic (m) value, whereas the high magnetic (m) value of the multilayer thin film according to an embodiment decreased as the content of copper increased.

Test Example 2: Analysis of Multilayer Thin Film

A multilayer thin film according to Example 3-3 was fabricated while controlling the thickness of each thin layer by accurately controlling the deposition time based on the deposition rate. To accurately measure the deposition rate, the thickness of the thin layer deposited was measured using a surface profiler and transmission electron microscopy (TEM). The results of the measurement are shown in FIG. 4. In addition, for accurate elemental profiling of the fabricated multilayer thin film, energy dispersive X-ray spectroscopy (EDS) was performed, and the results of EDS are shown in FIG. 5. Table 1 below shows the deposition rate of each thin layer.

TABLE 1

| | Power (W) | Deposition rate (nm/s) |
|---|---|---|
| $Co_{50}Cu_{50}$ | 5 | 0.0141 |
| $Co_{60}Cu_{40}$ | 5 | 0.0117 |
| $Co_{80}Cu_{20}$ | 5 | 0.0101 |
| Pt | 5 | 0.0332 |
| Ru | 10 | 0.0262 |
| Ta | 15 | 0.0440 |

As can be seen in FIG. 4, in the multilayer thin film according to an embodiment, each thin layer was accurately deposited to a desired thickness, and after the multilayer thin layer was heat-treated at 500° C., perpendicular magnetic anisotropy properties attributable to formation of a new bulk phase appeared.

As shown in FIG. 5, according to the order of deposition, platinum and ruthenium were first detected in the multilayer thin film, and then platinum, cobalt and copper were detected at the same time, and finally ruthenium started to be detected again. Such results suggest that the multilayer thin film according to an embodiment was accurately fabricated. In addition, from a comparison between the positions indicated by boxes in FIG. 5 (either before or after heat treatment), it can be seen that the structure of platinum-cobalt-copper was influenced by the ruthenium seed layer.

The above-described results support that the perpendicular magnetic anisotropy and low saturation magnetization properties of the multilayer thin film fabricated according to an embodiment depend directly on the structure consisting of the thin platinum layers and the thin cobalt-copper layer.

Test Example 3: Measurement of the Change in Saturation Magnetization with a Change in Copper Content For the multilayer thin film [Pt/$Co_{100-x}Cu_x$]$_6$ that is a new structure according to an embodiment, the effect of addition of copper was measured while increasing the thickness of the thin cobalt-copper layer including a non-magnetic component as a substitute for a portion of the magnetic layer, fixing the thickness of the thin platinum layer that is, non-magnetic layer, to 0.2 nm, and changing the content of copper in the thin cobalt-copper layer. In addition, the multilayer thin films having various cobalt-copper layer thicknesses and various copper contents were heat-treated at 300° C. and 500° C., and changes in the saturation magnetization were measured. The results of the measurements are shown in FIG. 6.

FIG. 6 is a set of graphs showing the results of measurement for a multilayer thin film. The top graph pair shows the results in which the thickness of each of the thin cobalt-copper layer deposited is 0.4 nm. The middle graph pair of FIG. 6 shows the results of measurement for a multilayer thin film in which the thickness of each of the thin cobalt-copper layers deposited is 0.5 nm. The bottom graph pair of FIG. 6 shows the results of measurement for a multilayer thin film in which the thickness of each of the thin cobalt-copper layers deposited is 0.5 nm.

When the thickness of the thin platinum layer was fixed to 0.2 nm and the magnetic layer made only of pure cobalt was deposited to a thickness of 0.4 nm, the saturation magnetization value of the multilayer thin film was 790 emu/cc. In addition, when the magnetic layer made only of pure cobalt was deposited to a thickness of 0.5 nm, the saturation magnetization value was as high as 1060 emu/cc. When the magnetic layer made only of pure cobalt was deposited to a thickness of 0.6 nm, the saturation magnetization value was as high as 1066 emu/cc. However, when the magnetic layer made of a mixture of cobalt and copper at an atomic ratio of 80:20 ($Co_{80}Cu_{20}$) was deposited to a thickness of 0.4 nm, the saturation magnetization value was 644 emu/cc. When the magnetic layer made of a multilayer of cobalt and copper was deposited to a thickness of 0.5 nm, the saturation magnetization value was 705 emu/cc. When the magnetic layer made of a multilayer of cobalt and copper was deposited to a thickness of 0.6 nm, the saturation magnetization value was 735 emu/cc. These results indicate that the saturation magnetization greatly decreased when the multilayer of cobalt and copper is employed. In addition, it was shown that the saturation magnetization linearly decreased as the amount of cobalt-to-copper increased.

Referring to FIG. 6, a multilayer thin film has the PMA density of $0.23\sim5.66\times10^6$ erg/cm$^3$ at 300~500 Celsius degrees, where a thickness of cobalt and copper is 0.4 nm. A multilayer thin film has the PMA density of $0.34\sim7.55\times10^6$ erg/cm$^3$ at 300~500 Celsius degrees, where a thickness of cobalt and copper is 0.5 nm, and a multilayer thin film has the PMA density of $0.27\sim5.45\times10^6$ erg/cm$^3$ at 300~500 Celsius degrees, where a thickness of cobalt and copper is 0.6 nm.

The saturation magnetization of the multilayer thin film heat-treated at 300° C. did not significantly differ from that which is not subject to heat treatment. However, when the multilayer thin film was heat-treated at a high temperature reaching 500° C., the saturation magnetization decreased over the whole region. This indicates that the structure according to an embodiment can exhibit more effective characteristics in the temperature range that is used in magnetic random access memory processes. In addition, the multilayer thin film having a content ratio of cobalt:copper of 80:20 showed a significant decrease in the perpendicular magnetic anisotropy energy density ($K_{eff}$), indicating that a content ratio of cobalt:copper of 85:15 to 70:30 is more preferable.

That is, when a magnetic layer in a multilayer thin film includes copper that replaces a portion of cobalt according to an embodiment, the saturation magnetization value of the multilayer thin film can be greatly reduced while the perpendicular magnetic anisotropy thereof is maintained. In addition, the multilayer thin film will securely exhibit perpendicular magnetic anisotropy even after heat treatment at a high temperature reaching 150 to 550° C. A multilayer thin film having desired perpendicular magnetic anisotropy energy density and saturation magnetization values can be obtained by controlling the replacement amount with copper.

The multilayer thin film according to an embodiment can be advantageously used in the fabrication and application of high-density magnetic random access memories.

As described above, the multilayer thin film according to an embodiment is fabricated by alternately depositing thin platinum layers and thin cobalt-copper layers on a substrate. The multilayer thin film according to an embodiment has magnetic layers including a non-magnetic material such as, copper that replaces a portion of a magnetic material such as, cobalt. In contrast, a conventional multilayer thin film having magnetic layers is formed only of a magnetic material. This replacement of a portion of cobalt with copper in the magnetic layers can reduce the saturation magnetization of the multilayer thin film to reduce the influence of stray fields while maintaining the perpendicular magnetic anisotropy. In addition, the perpendicular magnetic anisotropy multilayer thin film according to an embodiment exhibits perpendicular magnetic anisotropy even after heat treatment at 150 to 550° C., and has a reduced saturation magnetization value after heat treatment, indicating that it shows properties suitable for use in a high-density magnetic random access memory cell, particularly a pinned structure in the cell. Accordingly, the use of multilayer thin film according to an embodiment can be advantageous in high-performance and high-density magnetic random access memories.

In another embodiment of the present invention, the present invention provides a cobalt and platinum-based multilayer thin film having perpendicular magnetic anisotropy (PMA), which includes thin cobalt layers and thin platinum layers alternately deposited on a substrate, and has an inverted structure in which the thickness of the thin cobalt layers is greater than that of the thin platinum layers.

As described above, the cobalt and platinum-based multilayer thin film according to the prior art has a structure in which the thickness of a thin platinum layer that is a non-magnetic thin layer is greater than that of a thin cobalt layer that is a magnetic thin layer. It is known that PMA in this multilayer thin film according to the prior art occurs at the interface between the thin cobalt layer and the thin platinum layer. The multilayer thin film having this structure has a fatal disadvantage in that the PMA properties of the multilayer thin film before heat treatment are lost while the interface between the thin cobalt layer and the thin platinum layer, which is essential for the exhibition of PMA, is broken down in the heat-treatment temperature range that is used in current memory fabrication processes. This disadvantage makes it difficult to apply the prior cobalt and platinum-based multilayer thin film in the MRAM field. Accordingly, the present inventors have conducted studies while controlling the thickness of a thin cobalt layer (magnetic thin layer) and the thickness of a thin platinum layer (non-magnetic thin layer) over a wide range, and as a result, have found that, when the thickness of the thin cobalt layer is greater than that of the thin platinum layer, unexpected effects are achieved. Based on this finding, the present inventors have completed the present invention.

Therefore, the present invention provides a cobalt and platinum-based multilayer thin film having a structure in which the thickness of a thin cobalt layer that is a magnetic thin layer is greater than that of the thin platinum layer that is a non-magnetic thin layer. This structure in the present invention is referred to as "inverted structure", because the thickness ratio of the two layers in this structure is inverted compared to that in the prior art structure in which the thickness of the non-magnetic thin layer is greater than that of the magnetic thin film. As can be seen from the results of examples described later, the multilayer thin film having the inverted structure according to the present invention has an advantage in that, even when it is subjected to a heat treatment process in the heat treatment temperature range that is used in current memory fabrication processes, the PMA properties thereof are maintained intact or further improved. Thus, it has better properties compared to the multilayer thin film according to the prior art.

In the cobalt and platinum-based multilayer thin film according to the present invention, the ratio of the thickness of the thin cobalt layer to that of the thin platinum layer is not limited, as long as the former is thicker than the latter. Preferably, the ratio of the thickness of the thin cobalt layer to that of the thin platinum layer may be more than 1:1 but not more than 3:1. If the ratio of the thickness is not more than 1:1, the resulting structure is not an inverted structure, but is merely the same structure as that of the multilayer structure according to the prior art, and thus the characteristic effects of the present invention cannot be achieved. If the ratio of the thickness is more than 3:1, there will be problems in that the PMA energy density decreases and the PMA properties are greatly deteriorated during a heat treatment process.

In the multilayer thin film according to the present invention, the thickness of each of the thin platinum layers may range from 0.15 nm to 0.25 nm, and in this case, the thickness of each of the thin cobalt layers will be a thickness that satisfies the thickness ratio range, that is, a thickness ranging from more than 0.15 nm to 0.75 nm. If the thickness of each of the thin platinum layers is less than 0.15 nm, there will be problems in that the PMA energy density decreases and the layer is weak against a heat treatment process, and if the thickness is more than 0.25 nm, there will be a problem in that the PMA properties are rapidly deteriorated during a heat-treatment process.

Meanwhile, in the multilayer thin film having the inverted structure according to the present invention, each of the thin cobalt layers and the thin platinum layers may be deposited once, but the thin cobalt layer and the thin platinum layer are preferably alternately deposited several times in order to ensure better perpendicular magnetic anisotropy. Thus, each of the thin cobalt layer and the thin platinum layer may be deposited 1 to 10 times. However, if each of the layers is deposited more than 10 times, there will be a problem in that, when the resulting multilayer thin film is applied to an actual memory device, the resistance thereof increases, or the critical current value required for magnetization switching increases due to an increase in the volume of the magnetic thin layers, and thus the multilayer thin film is disadvantageous for commercial use.

Thus, when the layers are deposited 1-10 times to have thicknesses in the above-described thickness ranges, the total thickness of the multilayer thin film consisting of the thin cobalt layers and the thin platinum layers will range from 0.3 nm (when the thin cobalt layer and the thin platinum layer, each having a thickness of 0.15 nm, are each deposited once) to 10 nm (when the thin cobalt layer having a thickness of 0.25 nm and the thin platinum layer having a thickness of 0.75 nm are each deposited 10 times).

Meanwhile, the multilayer thin film according to the present invention is deposited on a substrate. The substrate may be made of any one material selected from the group consisting of silicon, glass, sapphire and magnesium oxide, but is not limited thereto. Also, in the multilayer thin film according to the present invention, a buffer layer and a seed layer may be deposited before the thin cobalt layer and the thin platinum layer are deposited on the substrate. Further, after the thin cobalt layer and the thin platinum layer are deposited, a protective layer may further be deposited thereon. The buffer layer, the seed layer or the protective layer may be made of any material that is generally used in the field to which the present invention pertains. For example, the buffer layer, the seed layer or the protective layer may be made of Au, Cu, Pd, Pt, Ta, Ru, or an alloy of two or more thereof, and may be deposited not only as a single layer, but also as a plurality of layers.

FIG. 1 is a cross-sectional view showing the structure of a multilayer thin film according to an embodiment of the present invention. Referring to FIG. 1, a Ta layer 110 serving as a buffer layer is deposited on a substrate 100, and a Pt layer 120 and Ru layer 130 serving as seed layers are deposited thereon. On the seed layers 120 and 130, each of a thin cobalt layer and a thin platinum layer, which constitute a cobalt and platinum-based multilayer thin film 140, are deposited N times to thicknesses of $t_{Co}$ and $t_{Pt}$, respectively. Then, a Ru layer 150 serving as a protective layer is finally deposited.

The present invention also provides a method for fabricating a cobalt and platinum-based multilayer thin film having an inverted structure, the method including the steps of: (a) depositing on a substrate a cobalt and platinum-based multilayer thin film having an inverted structure in which the thickness of thin cobalt layers is greater than that of thin platinum layers; and (b) heat-treating the multilayer thin film.

In the method according to the present invention, details regarding the ratio of the thickness of the thin cobalt layers to that of the thin platinum layers, the thickness of each of the thin platinum layers, the number of depositions of each layer, the material of the substrate, the buffer layer, the seed layer and the protective layer, are as described above. However, in the present invention according to the present invention, it is possible to fabricate a multilayer thin film having high thermal stability against a heat treatment process, which definitely differs from that in the prior art, because the multilayer thin film has an inverted structure. Specifically, in the method according to the present invention, the temperature of a heat treatment process that is performed after deposition of each layer may range from 150° C. to 500° C. This implies that the heat treatment process in the present invention can be performed in a significantly wider temperature range compared to the prior art, in view of the fact that the multilayer thin film fabrication process according to the prior art was required to be performed mainly in a low-temperature range due to problems associated with the thermal stability of the thin film structure. Thus, the method according to the present invention enables current memory fabrication processes to be performed in a convenient and cost-effective manner, allows the processes to be modified in various ways, and makes it possible to select various materials. Meanwhile, if the heat treatment temperature is lower than 150° C., no significant problem will occur, but if the heat treatment temperature is higher than 500° C., there may be a problem in that PMA properties are deteriorated.

Hereafter, the present invention will be described in further detail with reference to preferred examples. Fabrication of multilayer thin film according to another embodiment of the present invention will be described in details as below.

As a substrate, a high-quality (prime grade) wet-oxidation Si/SiO$_2$ substrate was used. On the substrate, a Ta buffer layer (5 nm thickness) was formed, and Pt (10 nm thickness) and Ru (30 nm thickness) seed layers were formed thereon in the close-packed direction. On the buffer layer and seed layers formed as described above, each of a multilayer thin film having an inverted structure according to the present invention, and a multilayer thin film according to the prior art, was formed while changing the thickness of a thin cobalt layer ($t_{Co}$ nm) that is a magnetic thin layer and the thickness of a thin platinum layer ($t_{Pt}$ nm) that is a non-magnetic layer. On each of the formed multilayer thin films, a Ru layer (3 nm thickness) serving as a protective layer was formed.

Figure 7:
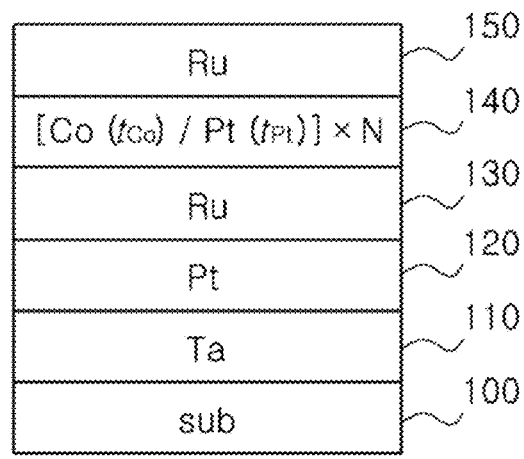
FIG. 7 is a cross-sectional view showing the structure of a multilayer thin film according to an embodiment of the present invention.

FIG. 7 shows a cross-sectional view of the multilayer thin film of the present invention, fabricated according to the above-described method. Each of the layers shown in FIG. 7 was deposited by a magnetron sputtering deposition process. The base pressure of a chamber used in the deposition was maintained at $1 \times 10^{-8}$ Torr or lower, and the deposition was performed at a pressure of about $2 \times 10^{-3}$ under an atmosphere of argon gas. In the deposition process, all the layers were formed by depositing single element targets (Ta, Pt, Ru and Co) under a vacuum. Particularly, the thin cobalt layer and the thin platinum layer were alternately deposited 6 times. The thickness of the thin layers was controlled by accurately controlling the deposition time based on the deposition rate. To accurately measure the rate of formation of the thin layers, the thicknesses of the deposited thin layers were measured using a surface profiler and scanning transmission electron microscopy (STEM). In addition, for accurate elemental profiling of the fabricated multilayer thin films, energy dispersive x-ray spectroscopy (hereinafter referred to as EDS) was used.

FIG. 8 shows an STEM image and an EDS profiling graph for a multilayer thin film fabricated by sequentially depositing elements according to an embodiment of the present invention. As can be seen in FIG. 8, each of the layers was accurately deposited to a desired thickness, and the component ratio was also accurately consistent with the desired ratio. After deposition of the multilayer thin film, heat treatment was performed under a vacuum of $1 \times 10^{-6}$ Torr or lower at a temperature of 300 to 500° C. for 1 hour.

Figure 8A:
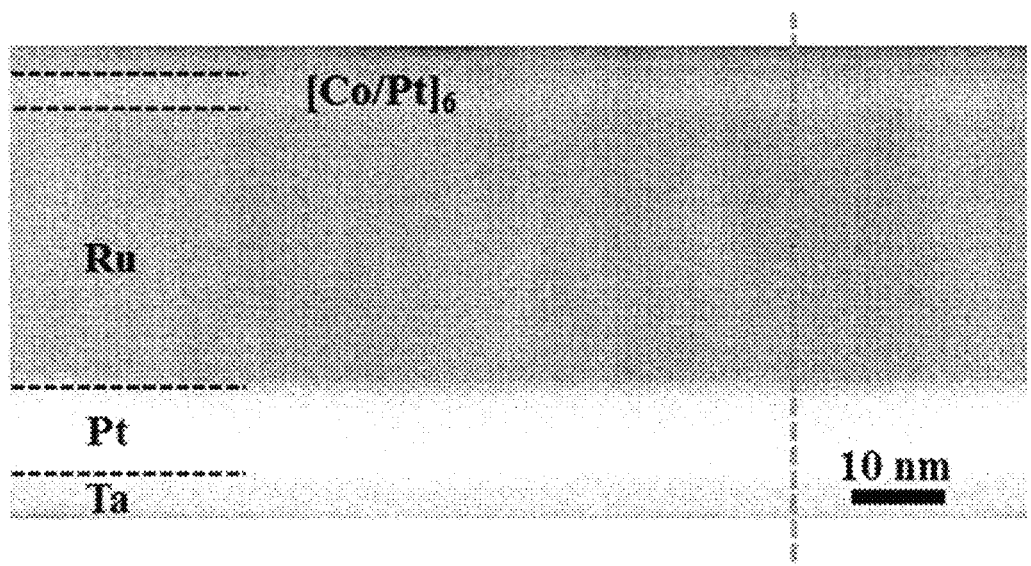
FIG. 8a is a scanning transmission electron microscopy image of [Co (0.32 nm)/Pt (0.2 nm)]$_6$ that is a cobalt and platinum-based multilayer thin film having an inverted structure according to an embodiment of the present invention.
Figure 8B:
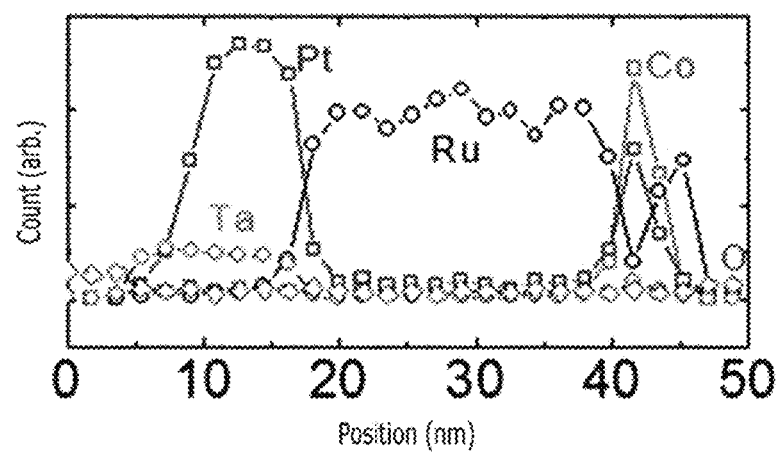

Specifically, FIG. 8a is an STEM image of [Co(0.32 nm)/Pt(0.2 nm)]$_6$ that is a cobalt and platinum-based multilayer thin film having an inverted structure according to an embodiment of the present invention. As can be seen therein, each of the layers was deposited to have a uniform thickness. FIG. 8b is a graph showing the profile of each of elemental components for the portions indicated by red dotted lines in FIG. 8a. As can be seen therein, the multilayer thin film was not substantially influenced by oxidation during the deposition process or before or after deposition. This supports that the PMA properties of the multilayer thin film according to the present invention depend directly only on the thicknesses of the thin layers of cobalt and platinum and on the heat treatment temperature.

FIGS. 9 and 10 are graphs showing the results of measuring magnetic moment (m)-hysteresis (H) curves for a multilayer thin film of the prior art and a multilayer thin film of the present invention in order to confirm the improved properties of the multilayer thin film fabricated according to the present invention. The m-H hysteresis curves were measured using a vibrating sample magnetometer at normal temperature. In addition, although not shown in the figures, the microstructures of the thin films were analyzed using an X-ray diffractometer and TEM microscopy.

Figure 9A:
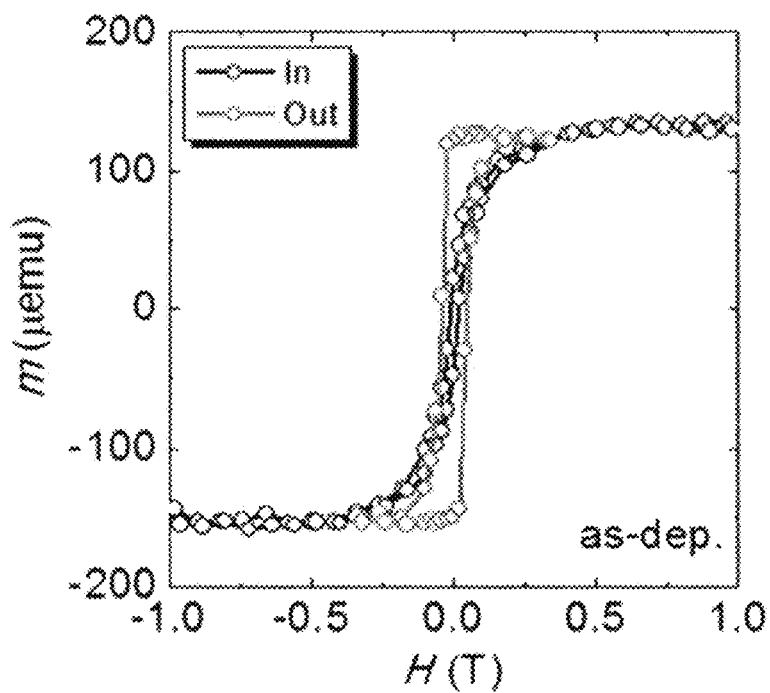
FIGS. 9a to 9c depict magnetic moment (m)-hysteresis (H) curves with heat-treatment temperature for [Co (0.2 nm)/Pt (0.28 nm)]$_6$ that is a multilayer thin film according to the prior art.
Figure 9B:
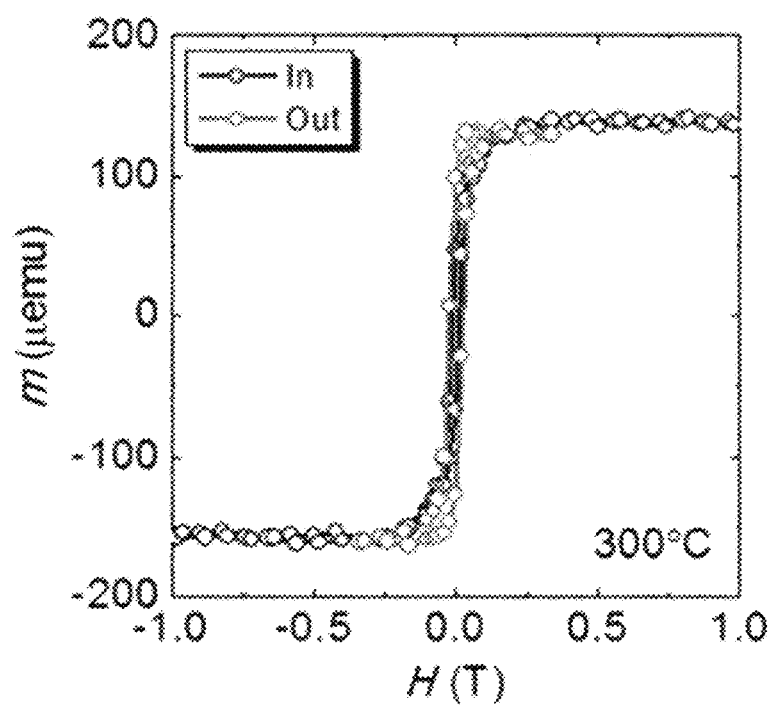
Figure 9C:
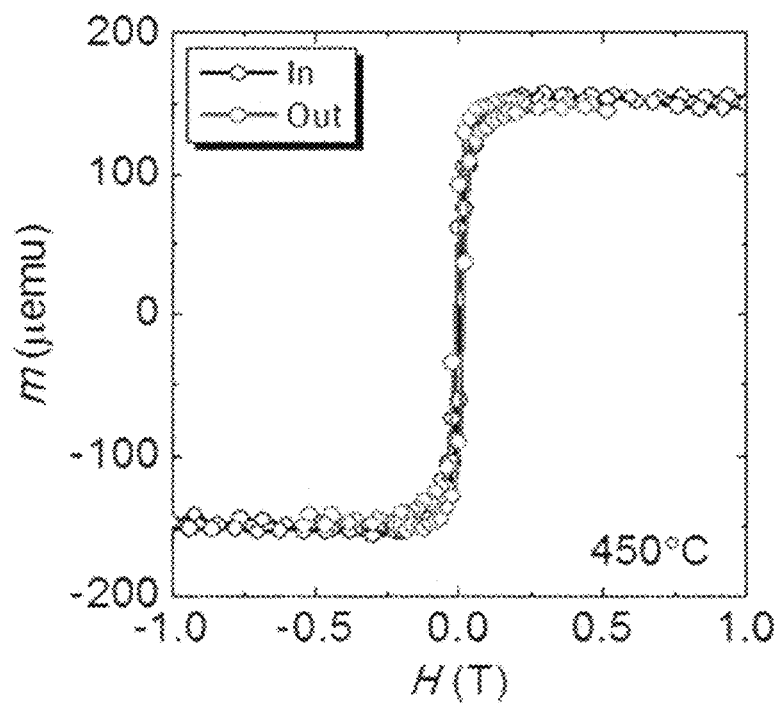

Specifically, FIGS. 9a to 9c depict m-H hysteresis curves with heat treatment temperature (3a: before heat treatment; 3b: after heat treatment at 300° C.; and 3c: after heat treatment at 450° C.) for [Co(0.2 nm)/Pt(0.28 nm)]$_6$, which is a multilayer thin film according to the prior art and has a structure in which the thickness of the non-magnetic thin layer is greater than that of the magnetic thin layer. More specifically, FIGS. 9a to 9c depict m-H hysteresis curves with heat treatment temperature, measured while applying an external magnetic field to the thin film surface in the out-of-plane direction and the in-plane direction.

As can be seen in FIGS. 9a to 9c, the definite PMA properties of the film before heat treatment (as-deposited) were greatly deteriorated after heat treatment, and the coercivity of the film in the out-of-plane direction also decreased. Such results suggest that the PMA properties of the multilayer thin film according to the prior art decrease after heat treatment or with an increase in heat treatment temperature.

Such characteristics are typical characteristics that appear a cobalt-platinum multilayer thin film in which the thickness of the non-magnetic thin layer is greater than that of the magnetic thin layer. It is understood that the PMA properties of the multilayer thin film according to the prior art occur at the interface between the thin cobalt layer and the thin platinum layer, but are lost while the interface between the thin cobalt layer and the thin platinum layer is broken down during heat treatment. Such observation results definitely suggest that there is a limit to the application of the cobalt-platinum multilayer thin film of the prior art to MRAM.

Figure 10A:
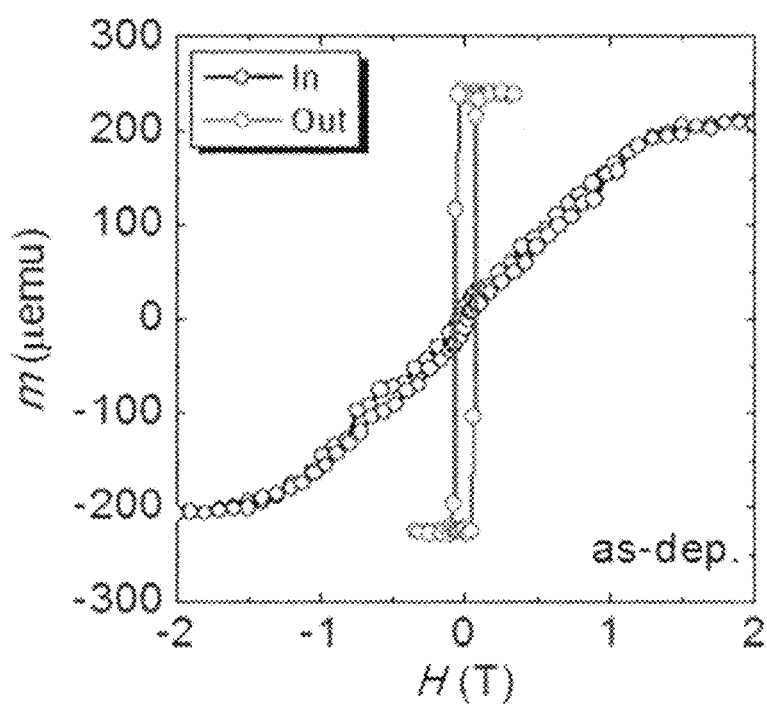
FIGS. 10a to 10c depict magnetic moment (m)-hysteresis (H) curves with heat-treatment temperature for [Co (0.32 nm)/Pt (0.2 nm)]$_6$ that is a cobalt and platinum-based multilayer thin film having an inverted structure according to the present invention.
Figure 10B:
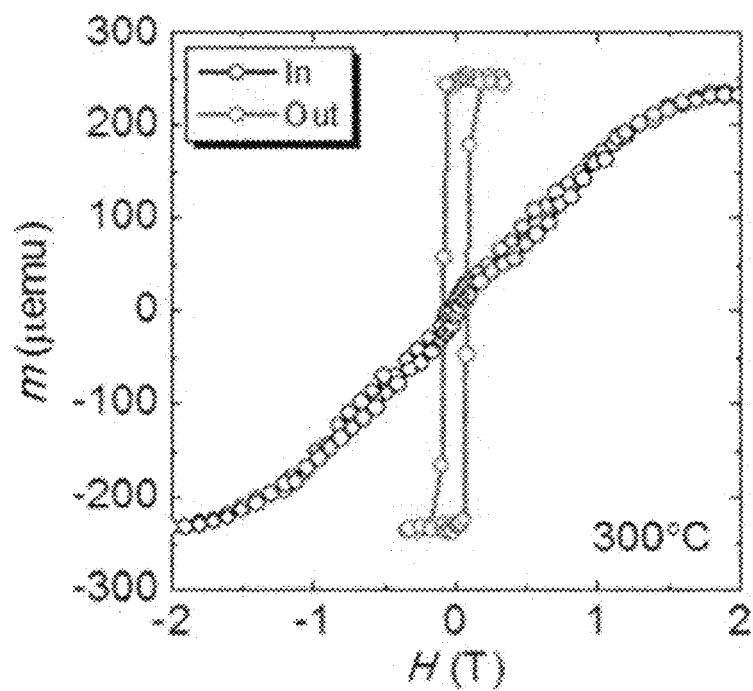
Figure 10C:
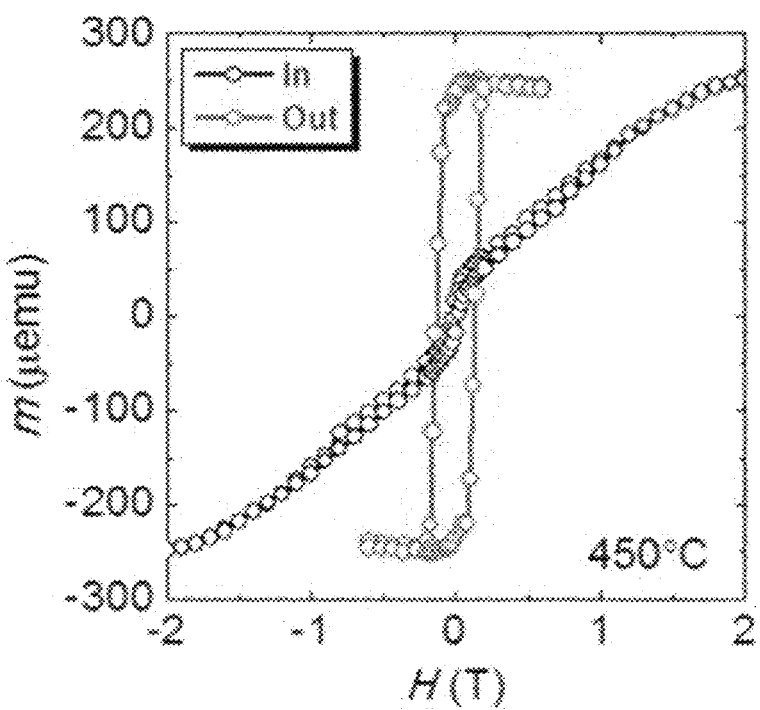

FIGS. 10a to 10c depict m-H hysteresis curves with heat treatment temperature (4a: before heat treatment; 4b: after heat treatment at 300° C.; and 4c: after heat treatment at 450° C.) for [Co(0.32 nm)/Pt(0.2 nm)]$_6$ that is a cobalt and platinum-based multilayer thin film having an inverted structure according to an embodiment of the present invention. As can be seen in FIG. 10a, the m-H hysteresis curve for the multilayer thin film of the present invention before heat treatment indicates more distinct PMA compared to the m-H hysteresis curve of the multilayer thin film of the prior art as shown in FIG. 9a. Thus, it can be seen that, before heat treatment, the multilayer thin film of the present invention has better perpendicular magnetic anisotropy compared to the multilayer thin film of the prior art.

As can be seen in FIG. 10b, the PMA properties of the multilayer thin film of the present invention before heat treatment were substantially maintained even after heat treatment at 300° C., suggesting that the multilayer thin film of the present invention can overcome the problem associated with the decrease in PMA properties after heat treatment, which is the problem of the prior art. Furthermore, as can be seen in FIG. 10c, the PMA properties of the multilayer thin film of the present invention are sufficiently maintained or improved even after heat treatment at 450° C., which is a temperature corresponding to the heat-treatment process temperature that is used in current memory fabrication processes. Also, from the behavior of the in-plane m-H hysteresis curve, it can be seen that, when the deposited multilayer thin film was heat-treated at 450° C., a second phase having in-plane magnetic anisotropy was finely formed. Particularly, from the fact that this in-plane magnetic anisotropy is formed after heat treatment of the multilayer thin film of the present invention, it can be seen that the effect of reducing the critical current value required for perpendicular magnetization switching can also be obtained.

FIGS. 11 and 12 are graphs showing the results of measuring saturation magnetization ($M_s$) and PMA energy density ($K_u$) while changing the thin cobalt layer thickness ($t_{Co}$ nm) and the thin platinum layer thickness ($t_{Pt}$ nm) to various values for [Co($t_{Co}$ nm)/Pt($t_{Pt}$ nm)]$_6$ structures, which are the multilayer thin film of the prior art and the multilayer thin film of the present invention, in order to examine the critical significance of the multilayer thin film fabricated according to the present invention.

Figure 11A:
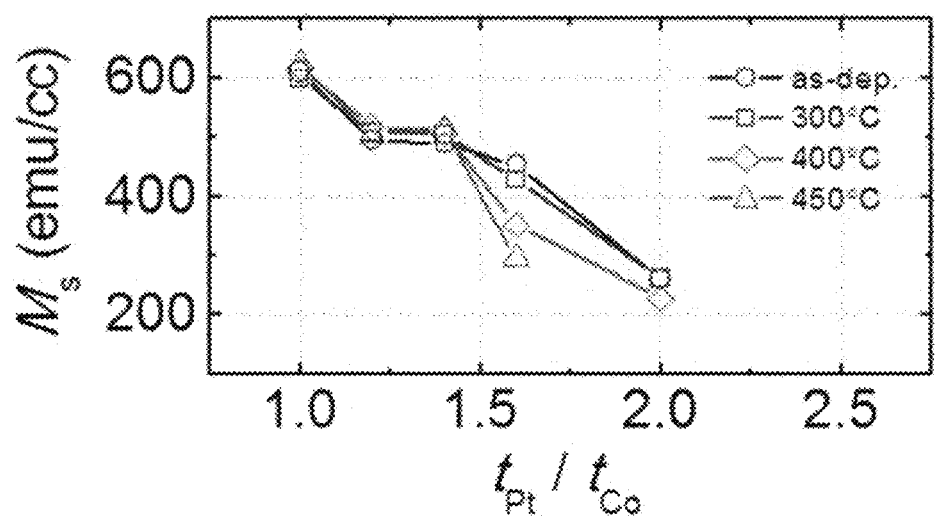
FIGS. 11a and 11b are graphs showing saturation magnetization ($M_s$) (FIG. 11a) and PMA energy density ($K_u$) (FIG. 11b) as a function of the thickness ratio ($t_{Pt}/t_{Co}$) for [Co(0.2 nm)/Pt($t_{Pt}$ nm)]$_6$. (Co thickness ($t_{Co}$)=fixed to 0.2 nm, and Pt thickness ($t_{Pt}$)=changed) that is a multilayer thin film according to the prior art.
Figure 11B:
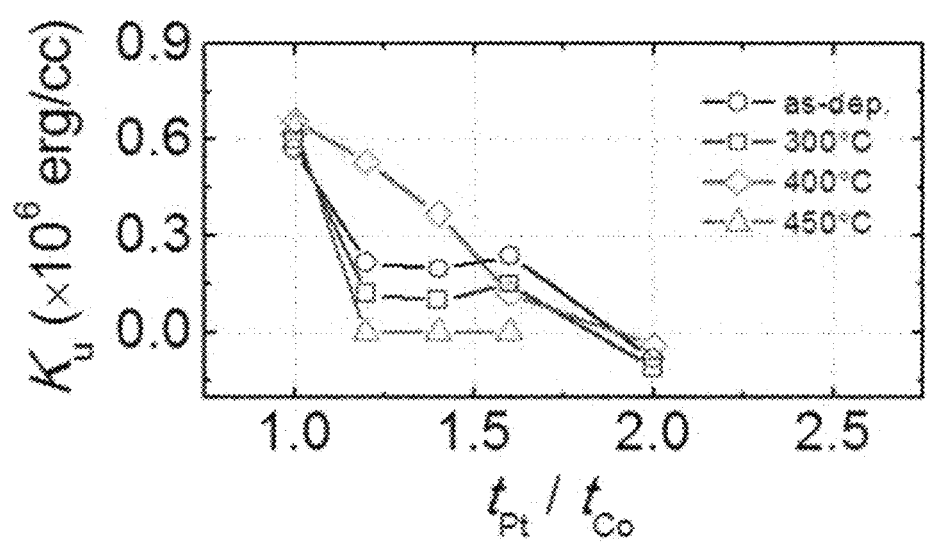

FIGS. 11a and 11b are graphs showing saturation magnetization ($M_s$) (FIG. 11a) and PMA energy density ($K_u$) (FIG. 11b) as a function of the thickness ratio ($t_{Pt}/t_{Co}$) for [Co(0.2 nm)/Pt($t_{Pt}$ nm)]$_6$ (Co thickness ($t_{Co}$)=fixed to 0.2 nm, and Pt thickness ($t_{Pt}$)=changed) that is a multilayer thin film according to the prior art. As shown in FIGS. 11a and 11b, as the thickness ratio was closer to that of the cobalt-platinum multilayer thin film of the prior art (that is, the thickness of the non-magnetic thin layer became greater), the durability of the multilayer thin film at the heat treatment temperatures decreased, and $M_s$ decreased, and $K_u$ also decreased due to a decrease in the in-plane saturation magnetization.

Figure 12A:
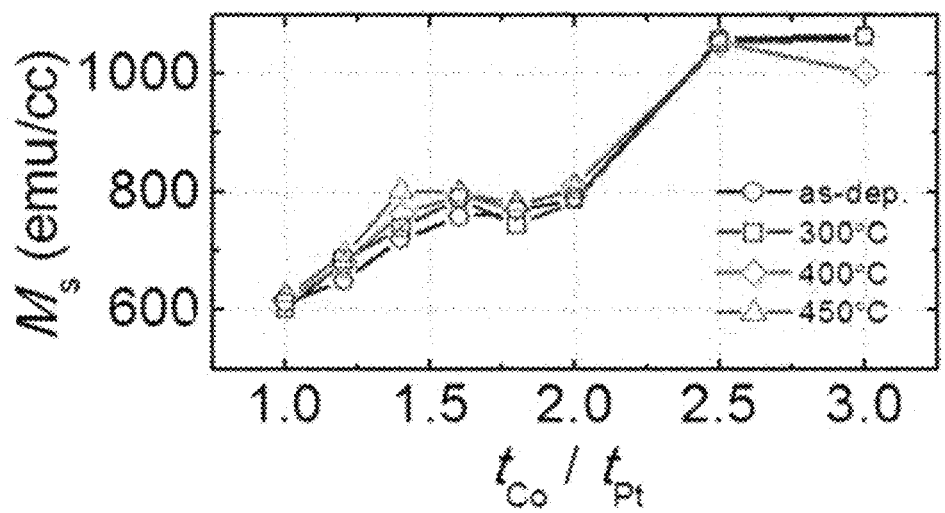
FIGS. 12a and 12b are graphs showing saturation magnetization ($M_s$) (FIG. 12a) and PMA energy density ($K_u$) (FIG. 12b) as a function of the thickness ratio ($t_{Pt}/t_{Co}$) for [Co($t_{Co}$ nm)/Pt(0.2 nm)]$_6$ (Co thickness ($t_{Co}$)=fixed to 0.2 nm, and Pt thickness ($t_{Pt}$)=changed) that is a cobalt and platinum-based multilayer thin film having an inverted structure according to an embodiment of the present invention.
Figure 12B:
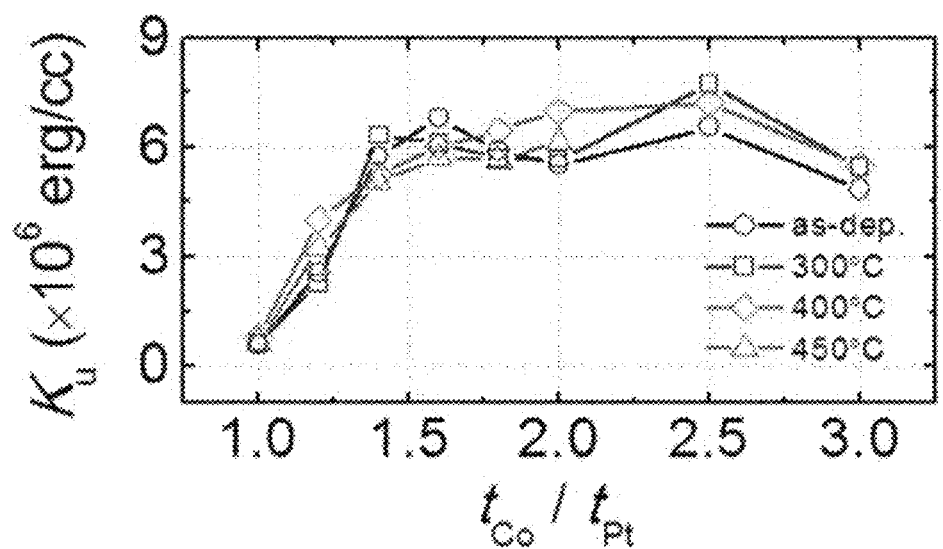

On the other hand, FIGS. 12a and 12b are graphs showing saturation magnetization ($M_s$) (FIG. 12a) and PMA energy density ($K_u$) (FIG. 12b) as a function of the thickness ratio ($t_{Pt}/t_{Co}$) for [Co ($t_{Co}$ nm)/Pt (0.2 nm)]$_6$ (Co thickness ($t_{Co}$) =fixed to 0.2 nm, and Pt thickness ($t_{Pt}$)=changed) that is a cobalt and platinum-based multilayer thin film according to an embodiment of the present invention. As can be seen therein, the cobalt-platinum multilayer thin film having the inverted structure according to the present invention, that is, structures having a fixed, non-magnetic thin layer of 0.2 nm and gradually increasing, magnetic thin layer thicknesses greater than 0.2 nm, showed sufficient durability even in the heat treatment process, and showed significantly improved PMA properties compared to the structure of the prior art.

Also, before heat treatment and after heat treatment at about 500° C., the $K_u$ value was the highest in a cobalt-platinum multilayer thin film having an inverted structure of [Co (0.5 nm)/Pt (0.2 nm)]$_6$, and showed a tendency to decrease as the thickness of the magnetic thin layer increased. Particularly, this heat treatment temperature is a temperature very close to the heat treatment temperature (300 to 450° C.) that is used in current memory fabrication processes. In addition, such results definitely suggest that, when the thickness ratio of the layers in the multilayer thin film having the inverted structure according to the present invention is finely controlled, the PMA energy density of the multilayer thin film can be easily controlled, and a structure having stronger PMA properties can also be obtained.

What is claimed is:

1. A perpendicular magnetic anisotropy multilayer thin film for a magnetic random access memory, comprising:
   a platinum layer and a cobalt-copper layer alternately deposited to form a multilayer thin film over a substrate,
   wherein the cobalt-copper layer is thicker than the platinum layer;
   wherein a content atomic ratio of cobalt:copper in the cobalt-copper layers is 50:50 to 90:10;
   wherein the multilayer thin film including the platinum layer and the cobalt-copper layer is repeatedly stacked over the substrate 2-10 turns;
   wherein the multilayer thin film has a total thickness of 0.3 nm-12.5 nm; and
   wherein the multilayer thin film has a perpendicular magnetic anisotropy (PMA) energy density of 0.23~5.66×10$^6$ erg/cm$^3$ at 300~500 Celsius degrees, and a saturation magnetization value of 735 emu/cc or less.

2. The perpendicular magnetic anisotropy multilayer thin film of claim 1, wherein a thickness f the platinum layer in the multilayer thin film ranges from 0.15 nm to 0.25 nm.

3. The perpendicular magnetic anisotropy multilayer thin film of claim 1, wherein the thickness ratio of the cobalt-copper layer to the platinum layer is 1.1:1~4.0:1.

4. The perpendicular magnetic anisotropy multilayer thin film of claim 1, further comprising:
   a stack of a buffer layer and a seed layer, which are provided between the substrate and the multilayer thin film, and
   a protective layer deposited over the multilayer thin film.

5. The perpendicular magnetic anisotropy multilayer thin film of claim 4, wherein each of the buffer layer, the seed layer, and the protective layer independently includes gold (Au), palladium (Pd), copper (Cu), platinum (Pt), tantalum (Ta), ruthenium (Ru), or a combination thereof.

6. The perpendicular magnetic anisotropy multilayer thin film of claim 1, wherein a critical current value required for a perpendicular magnetization switching is 1 MA/cm$^2$ or less.

7. The perpendicular magnetic anisotropy multilayer thin film of claim 1, wherein the platinum layer has a thickness of 0.2 nm and the cobalt-copper layer has a thickness of 0.4, or 0.5 or 0.6 nm.

8. The perpendicular magnetic anisotropy multilayer thin film of claim 1, wherein a content atomic ratio of cobalt:copper in the cobalt-copper layer is 85/15 to 70/30.

9. The perpendicular magnetic anisotropy multilayer thin film of claim 1, wherein a thickness of the platinum layer in the multilayer thin film ranges from 0.15 nm to 0.25 nm and a ratio of a thickness of the cobalt-copper layer to the thickness of the platinum layer is 0.6:1 to 4.0:1.

10. The perpendicular magnetic anisotropy multilayer thin film of claim 1, wherein the multilayer thin film has a total thickness of 0.96 nm-12.5 nm.

11. The perpendicular magnetic anisotropy multilayer thin of claim 1, wherein the substrate is made of a material selected from the group consisting of silicon, glass, sapphire and magnesium oxide.

12. A magnetic random access memory device comprising the perpendicular magnetic anisotropy multilayer thin film of claim 1.

* * * * *